United States Patent
Herrault

(10) Patent No.: US 11,158,520 B2
(45) Date of Patent: Oct. 26, 2021

(54) METHOD TO PROTECT DIE DURING METAL-EMBEDDED CHIP ASSEMBLY (MECA) PROCESS

(71) Applicant: HRL Laboratories, LLC, Malibu, CA (US)

(72) Inventor: Florian G. Herrault, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 34 days.

(21) Appl. No.: 16/739,001

(22) Filed: Jan. 9, 2020

(65) Prior Publication Data

US 2020/0294816 A1 Sep. 17, 2020

Related U.S. Application Data

(60) Provisional application No. 62/816,839, filed on Mar. 11, 2019.

(51) Int. Cl.
*H01L 21/48* (2006.01)
*H01L 21/683* (2006.01)
*H01L 23/367* (2006.01)

(52) U.S. Cl.
CPC ...... *H01L 21/4882* (2013.01); *H01L 21/6835* (2013.01); *H01L 23/3675* (2013.01);
(Continued)

(58) Field of Classification Search
None
See application file for complete search history.

(56) References Cited

U.S. PATENT DOCUMENTS 6,319,834 B1 * 11/2001 Erb ............... H01L 21/2885
257/E21.175
8,617,927 B1 * 12/2013 Margomenos ........ H01L 23/36
438/112
(Continued)

FOREIGN PATENT DOCUMENTS

KR 10-2014-0001898 A 1/2014
WO WO 2012/054335 A1 4/2012

OTHER PUBLICATIONS

"Electrophoretic Deposition (EPD): Fundamentals and Applications from Nano- to Microscale Structures" by Amrollahi et al. (Year: 2015).*

(Continued)

*Primary Examiner* — Evren Seven
(74) *Attorney, Agent, or Firm* — Ladas & Parry

(57) ABSTRACT

A process for assembling microelectronic or semiconductor chips, comprising: providing a semiconductor chip having an active face with a connection pad; coating the active face of the semiconductor chip with a conformal dielectric material layer, such that the connection pad is completely coated by the conformal dielectric material layer; temporarily adhering the active face of the semiconductor chip to a carrier wafer; temporarily adhering the carrier wafer to a wafer-with-a-through-cavity such that the semiconductor chip extends into the through-cavity; assembling the semiconductor chip to the wafer-with-the-through-cavity by filling the through-cavity with a heat spreader material; releasing the assembled semiconductor chip and wafer-with-the-through-cavity from the carrier wafer; removing the conformal dielectric material layer from at least a portion of the connection pad; and forming an electrical connection to said at least a portion of the connection pad.

16 Claims, 10 Drawing Sheets

(52) U.S. Cl.
CPC .............. *H01L 2221/6834* (2013.01); *H01L 2221/68313* (2013.01)

(56) References Cited

U.S. PATENT DOCUMENTS

| | | | |
|---|---|---|---|
| 9,059,140 B1 | 6/2015 | Margomenos | |
| 9,093,394 B1 | 7/2015 | Margomenos | |
| 9,209,142 B1* | 12/2015 | Lambert | H01L 21/683 |
| 9,337,124 B1 | 5/2016 | Herrault | |
| 9,385,083 B1 | 7/2016 | Herrault | |
| 9,842,814 B1 | 12/2017 | Herrault | |
| 10,026,672 B1 | 7/2018 | Herrault | |
| 10,079,160 B1 | 9/2018 | Margomenos | |
| 2001/0010894 A1* | 8/2001 | Shin | H01L 21/76835 430/312 |
| 2004/0067640 A1* | 4/2004 | Hsu | H01L 21/76877 438/637 |
| 2004/0087126 A1* | 5/2004 | Fartash | H01L 21/76898 438/597 |
| 2005/0110082 A1* | 5/2005 | Cheng | H01L 29/7843 257/341 |
| 2005/0156322 A1 | 7/2005 | Smith et al. | |
| 2006/0033219 A1 | 2/2006 | Kalidas et al. | |
| 2008/0299685 A1* | 12/2008 | Matsunami | H01L 21/561 438/15 |
| 2008/0315434 A1* | 12/2008 | McElrea | H01L 21/6835 257/777 |
| 2010/0029045 A1* | 2/2010 | Ramanathan | H01L 24/19 438/114 |
| 2011/0291249 A1* | 12/2011 | Chi | H01L 21/561 257/675 |
| 2012/0314388 A1* | 12/2012 | Bower | H01L 24/83 361/760 |
| 2014/0357020 A1* | 12/2014 | Aleksov | H01L 21/6835 438/107 |
| 2015/0155264 A1* | 6/2015 | Sridharan | H01L 21/78 438/113 |
| 2015/0214127 A1* | 7/2015 | Gu | H01L 23/5389 257/712 |
| 2015/0243575 A1* | 8/2015 | Strothmann | H01L 24/97 257/773 |
| 2015/0259194 A1* | 9/2015 | Lin | H01L 24/19 257/773 |
| 2016/0043047 A1* | 2/2016 | Shim, II | H01L 21/56 257/773 |
| 2016/0155900 A1* | 6/2016 | Bono | H01L 33/641 438/27 |
| 2016/0379943 A1* | 12/2016 | Mason | H01L 21/6835 257/506 |
| 2017/0110413 A1* | 4/2017 | Chen | H01L 24/20 |
| 2018/0130691 A1* | 5/2018 | Uzoh | H01L 24/95 |
| 2018/0166313 A1* | 6/2018 | Dai | H01L 21/6835 |
| 2018/0233395 A1* | 8/2018 | Okita | H01L 21/6836 |
| 2018/0308813 A1* | 10/2018 | Chia | H01L 24/20 |
| 2018/0323575 A1* | 11/2018 | Caer | H01S 5/02484 |
| 2019/0096699 A1* | 3/2019 | Chiang | H01L 23/3128 |
| 2019/0096821 A1* | 3/2019 | Chiang | H01L 23/3171 |
| 2019/0198449 A1 | 6/2019 | Herrault | |
| 2019/0198456 A1* | 6/2019 | Petzold | H01L 29/66772 |
| 2020/0013859 A1* | 1/2020 | Schaeffer | H01L 21/0485 |
| 2020/0091126 A1* | 3/2020 | Lin | H01L 23/49816 |
| 2020/0194558 A1* | 6/2020 | Brockmeier | H01L 29/1608 |
| 2020/0203302 A1* | 6/2020 | Chew | H01L 21/568 |
| 2020/0381380 A1* | 12/2020 | Lee | H01L 21/561 |

OTHER PUBLICATIONS

"SCS Parylene Properties" (Year: 2021).*
International Search Report issued with respect to International Application No. PCT/US2020/012988 dated Jun. 25, 2020.
Written Opinion issued with respect to International Application No. PCT/US2020/012988 dated Jun. 25, 2020.

* cited by examiner

CMOS chip as received

*CMOS chip after MECA backside process*

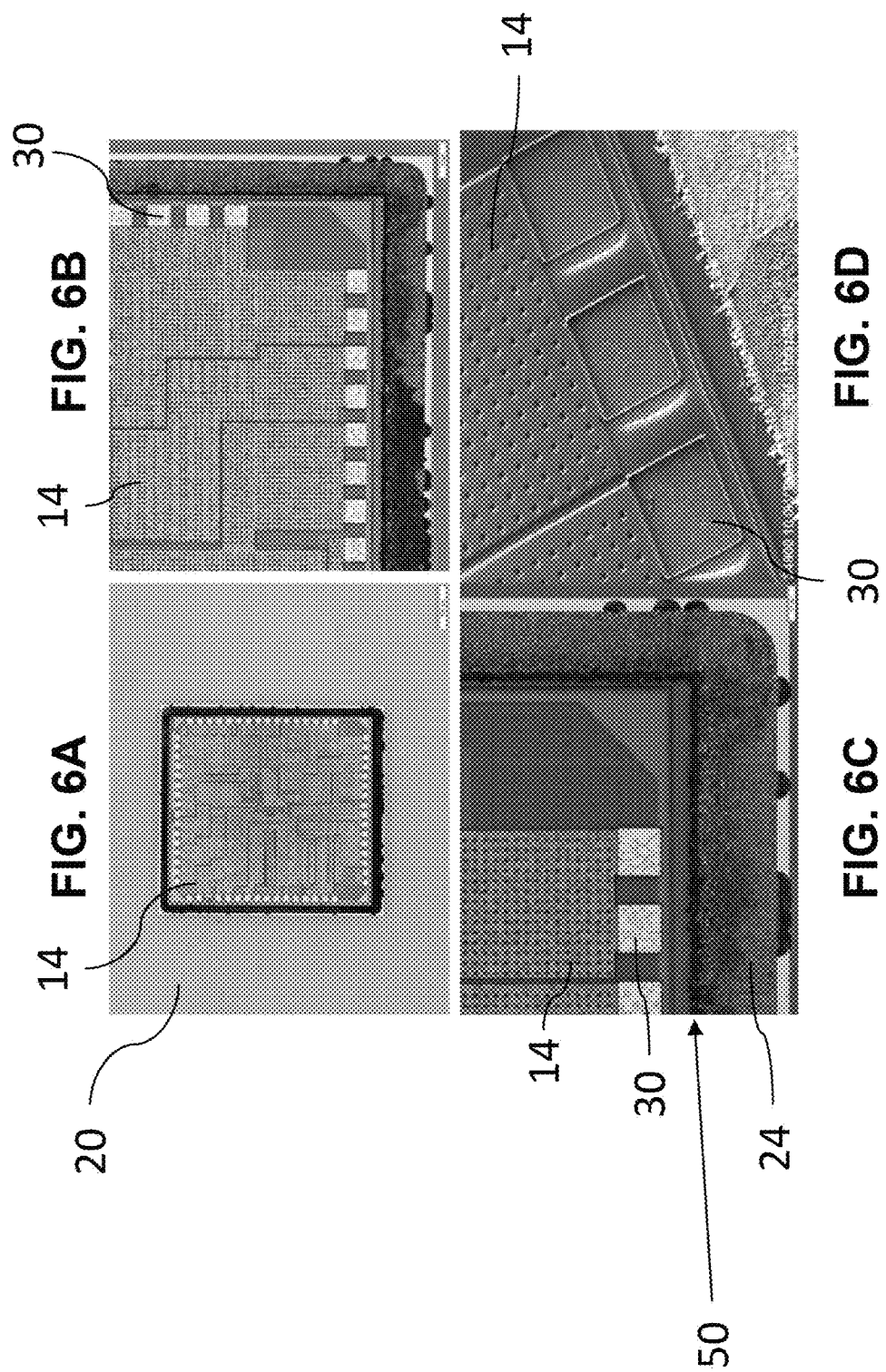

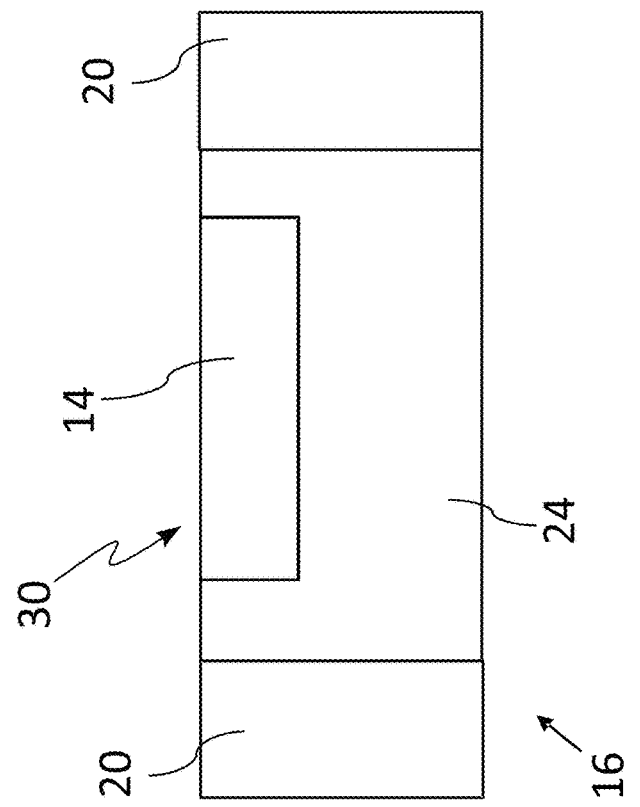
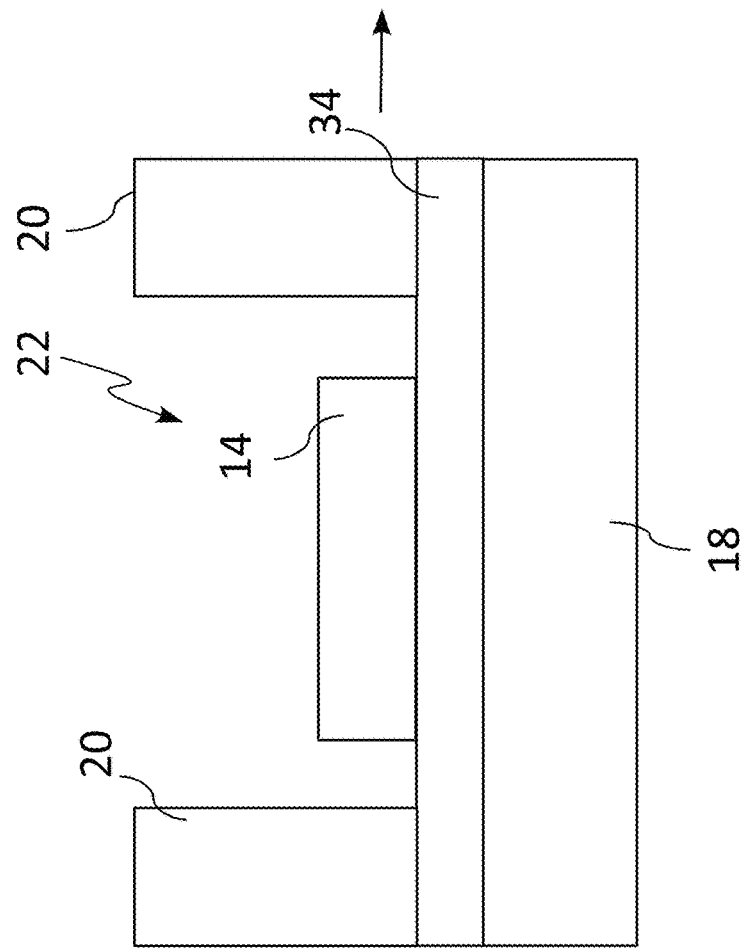
FIG. 7B
FIG. 7A

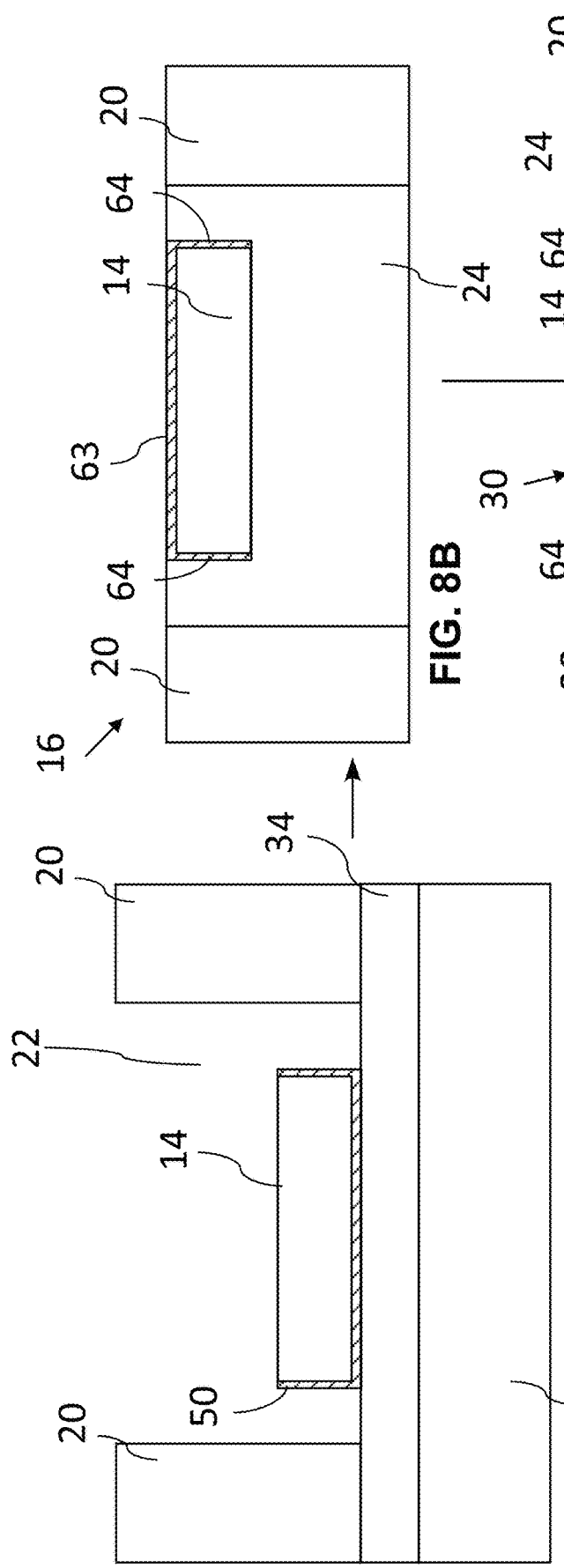
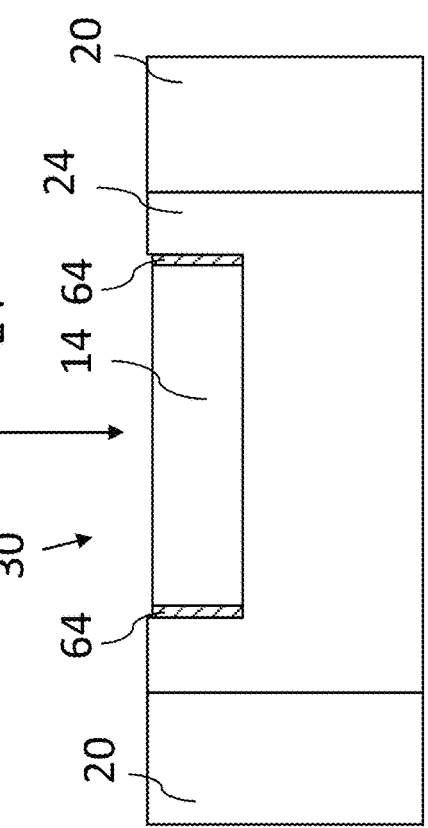
FIG. 8A
FIG. 8B
FIG. 8C

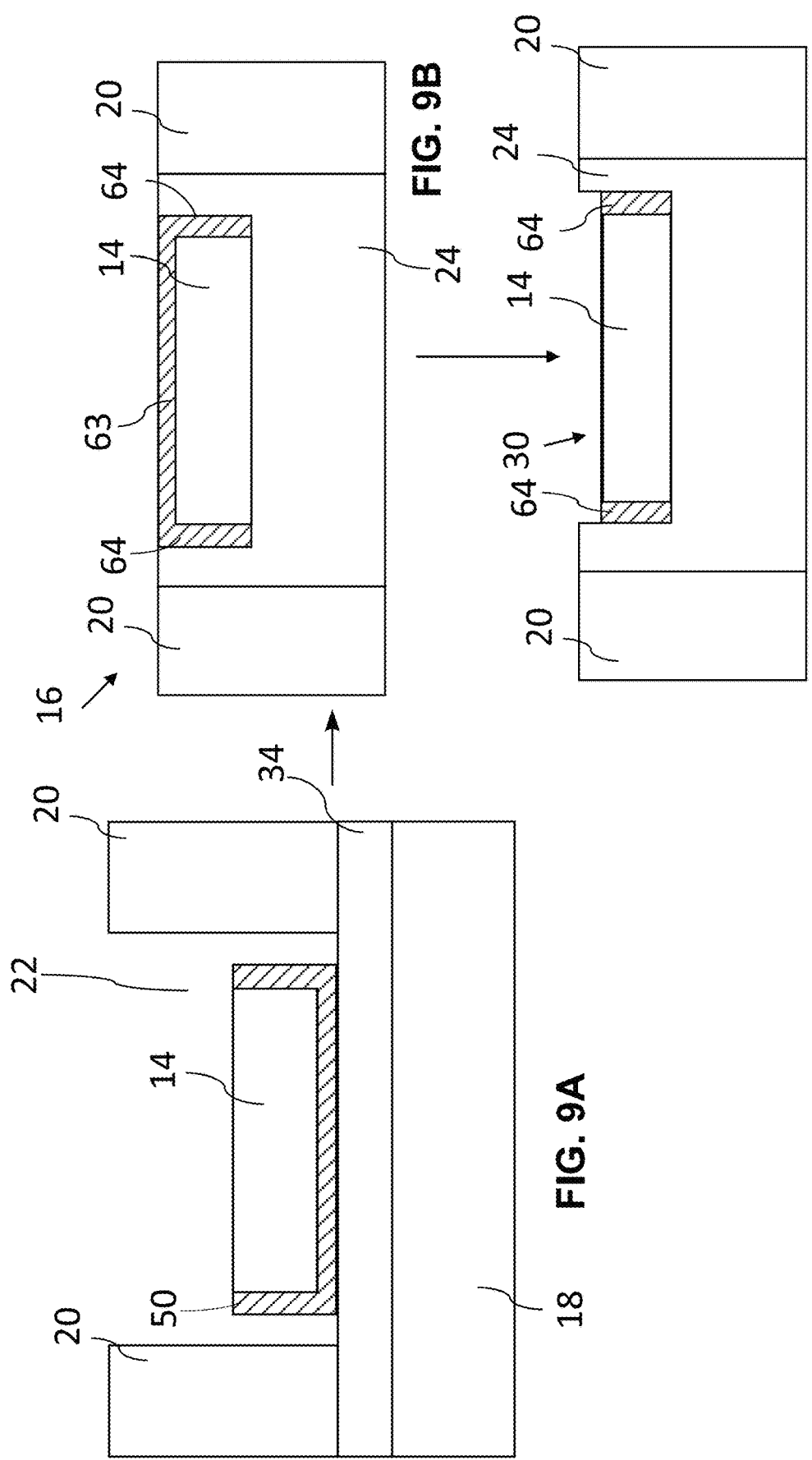

METHOD TO PROTECT DIE DURING METAL-EMBEDDED CHIP ASSEMBLY (MECA) PROCESS

RELATED APPLICATIONS

This application relates to and claims the benefit of U.S. Patent Application No. 62/816,839 (Method to Protect Die During Metal-Embedded Chip Assembly (MECA) Process), filed on Mar. 11, 2019, which is hereby incorporated by reference.

NOTICE OF GOVERNMENT FUNDING

This invention was made with government support under contract number FA8650-13-C-7324 awarded by Defense Advanced Research Projects Agency (DARPA). The government has certain rights in this invention.

TECHNICAL FIELD

This presentation is directed in general to a process and apparatus for assembling microelectronic or semiconductor chips.

BACKGROUND

This application is related to a series of US patents and US patent publications, as detailed hereafter.

This application is related to U.S. Pat. No. 8,617,927 (hereinafter "Margomenos") issued on Dec. 31, 2013, which is hereby incorporated by reference. Margomenos presents a method and apparatus for mounting microelectronic chips to a thermal heat sink. The chips are arranged in a desired configuration with their active faces all facing a common direction and with their active faces defining a common planar surface for all of said chips. A metallic material is applied to the chips, preferably by electrodeposition to backsides of the chips, the metallic material being electroformed thereon and making void-free contact with the backsides of the chips.

This application is also related to U.S. patent application Ser. No. 16/158,212 (hereinafter "Herrault") filed on Oct. 11, 2018 (now published as US Publication No. 2019/0198449 A1 on Jun. 27, 2019), which is hereby incorporated by reference. Herrault presents an electronic assembly, comprising a carrier wafer having a top wafer surface and a bottom wafer surface; an electronic integrated circuit being formed in the carrier wafer and comprising a wafer contact pad on the top wafer surface; said carrier wafer comprising a through-wafer cavity joining the top and bottom wafer surfaces; a component chip having a component chip top surface, a component chip bottom surface and component chip side surfaces, the component chip being held in said through-wafer cavity by an attachment material attaching at least one wall of the through-wafer cavity to at least one of the component chip bottom surface and a component chip side surface; said component chip comprising at least one component contact pad on said component chip top surface; a first conductor connecting said wafer contact pad and said component contact pad.

This application is related to U.S. Pat. No. 10,026,672 (hereinafter "Herrault-2") issued on Jul. 17, 2018, which is hereby incorporated by reference. Herrault-2 presents a recursive metal-embedded chip assembly (R-MECA) process and method described for heterogeneous integration of multiple die from diverse device technologies. The recursive aspect of this integration technology enables integration of increasingly-complex subsystems while bridging different scales for devices, interconnects and components. Additionally, the proposed concepts include high thermal management performance that is maintained through the multiple recursive levels of R-MECA, which is a key requirement for high-performance heterogeneous integration of digital, analog, mixed-signal and RF subsystems. At the wafer-scale, chips from diverse technologies and different thicknesses are initially embedded in a metal heat spreader surrounded by a mesh wafer host. An embodiment uses metal embedding on the backside of the chips as a key differentiator for high-density integration, and built-in thermal management. After die embedding, wafer-level front side interconnects are fabricated to interconnect the various chips. The wafer is then diced into individual metal-embedded chip assembly (MECA) modules, and forms the level one for multi-scale R-MECA integration. These modules are subsequently integrated into another wafer or board using the same integration approach recursively. Additional components such as discrete passive resistors, capacitors and inductors can be integrated at the second level, once the high-resolution, high-density integration has been performed at level one. This recursive integration offers a practical solution to build very large scale integrated systems and subsystems.

This application is also related to U.S. Pat. No. 9,842,814 (hereinafter "Henault-3") issued on Dec. 12, 2017, which is hereby incorporated by reference. Herrault-3 presents an integrated radio frequency (RF) subsystem including a chip substrate, a circuit patterned on a first surface of the chip substrate, a probe electrically integrated with the circuit on a first side of the chip substrate, a frame at a second side of the chip substrate defining a first cavity underneath the circuit.

This application is also related to U.S. Pat. No. 9,385,083 (hereinafter "Henault-4") issued on Jul. 5, 2016, which is hereby incorporated by reference. Herrault-4 presents an interconnect for electrically coupling pads formed on adjacent chips or on packaging material adjacent the chips, with an electrically conductive heat sink being disposed between the pads, the interconnect comprising a metallic membrane layer disposed between two adjacent pads and disposed or bridging over the electrically conductive heat sink so as to avoid making electrical contact with the electrically conductive heat sink. An electroplated metallic layer is disposed on the metallic membrane layer. Fabrication of interconnect permits multiple interconnects to be formed in parallel using fabrication techniques compatible with wafer level fabrication of the interconnects. The interconnects preferably follow a smooth curve to electrically connect adjacent pads and following that smooth curve they bridge over the intervening electrically conductive heat sink material in a predictable fashion.

This application is also related to U.S. Pat. No. 9,337,124 (hereinafter "Henault-5") issued on May 10, 2016, which is hereby incorporated by reference Herrault-5 presents a method for forming a wafer level heat spreader, including providing a mesh wafer, the mesh wafer having a plurality of openings and mesh regions between the openings, bonding the mesh wafer to a backside of an integrated circuit (IC) wafer, the IC wafer comprising a plurality of circuits; and electrodepositing a heat sink material through the plurality of openings and onto the backside of the IC wafer.

This application is also related to U.S. Pat. No. 10,079,160 (hereinafter "Margomenos-2") issued on Sep. 18, 2018, which is hereby incorporated by reference. Margomenos-2 presents a method of mounting one or more semiconductor or microelectronic chips, which includes providing a carrier; temporarily adhering the one or more semiconductor or microelectronic chips to the carrier with active faces of the one or more chips facing towards the carrier; providing a package body with at least one chip-receiving opening therein and with at least one contact opening therein; temporarily adhering the package body to the carrier with the at least one opening in the package body accommodating at least a portion of the one or more chips; covering backsides of the one or more chips and filling empty spaces between the one or more chips and walls of the at least one opening in the package body with a metallic material; filling the at least one contact opening with the aforementioned metallic material; wirebonding contacts on the active faces of the one or more chips with contact surfaces in electrical communication with the metallic material in the at least one contact opening; and releasing package body with the one or more chips embedded in the metallic material from the carrier.

This application is also related to U.S. Pat. No. 9,093,394 (hereinafter "Margomenos-3") issued on Jul. 28, 2015, which is hereby incorporated by reference. Margomenos-3 presents a semiconductor device comprising one or more transistors and two or more layers of dielectric material encapsulating a front side of said one or more transistors. The gate of each of said one or more transistors is located within a cavity, or air-box, in at least one of the dielectric layers, so that the gate terminal is physically separated from said dielectric material. Such an arrangement may reduce parasitic capacitance. In another arrangement, a semiconductor device comprises one or more gallium nitride high electron mobility transistors and one or more dielectric layers encapsulating a front side of said one or more transistors, wherein the gate terminal of each of said one or more transistors is located within a cavity in at least one of the one or more dielectric layers, separated from said dielectric material.

This application is also related to U.S. Pat. No. 9,059,140 (hereinafter "Margomenos-4") issued on Jun. 16, 2015, which is hereby incorporated by reference. Margomenos-4 presents a method of mounting a plurality of semiconductor or microelectronic chips or die, the method including providing a carrier, temporarily adhering the plurality of semiconductor or microelectronic chips or die to the carrier with active faces of the chips or die facing towards the carrier, covering backsides of the chips and filling empty spaces between the chips or die with a metallic material to thereby define an assembly of the chips or die and the metallic material, and releasing the assembly from the carrier, wherein each chip or die comprises at least one bonding ring higher than a height of the active face of the respective chip or die or any connections on the active face of the respective chip or die.

Embodiments of this presentation relate to protecting microelectronic or semiconductor chips during a metal-embedded chip assembly (MLCA) process.

Embodiments of this presentation relate to a process for assembling microelectronic or semiconductor chips, comprising: providing at least one semiconductor chip having an active face with at least one connection pad; coating the active face of said at least one semiconductor chip with a conformal dielectric material layer, such that said at least one connection pad is completely coated by said conformal dielectric material layer; temporarily adhering said active face of said at least one semiconductor chip to a carrier wafer; temporarily adhering the carrier wafer to a wafer with a through-cavity such that said at least one semiconductor chip extends into the through-cavity; assembling said at least one semiconductor chip to the wafer with the through-cavity by filling the through cavity with a heat spreader material; releasing the assembled at least one semiconductor chip and wafer with the through-cavity from the carrier wafer; removing the conformal dielectric material layer from at least a portion of said at least one connection pad; and forming at least one electrical connection to said at least a portion of said at least one connection pad.

According to embodiments of this presentation, said coating the active face of said at least one semiconductor chip with the conformal dielectric material layer is conducted at room temperature.

According to embodiments of this presentation said conformal dielectric material layer is transparent.

According to embodiments of this presentation, said conformal dielectric material layer is 0.1 to less than 10 micrometers thick.

According to embodiments of this presentation, said conformal dielectric material layer is 0.5 micrometers thick.

According to embodiments of this presentation, said conformal dielectric material layer comprises parylene, aluminum oxide ($Al_2O_3$), epoxy, or a photoresist.

According to embodiments of this presentation said conformal dielectric material layer comprises parylene N, parylene C, parylene AF-4, parylene X, parylene VT-4, parylene D, parylene M, or parylene E.

According to embodiments of this presentation, said coating the active face of said at least one semiconductor chip with the conformal dielectric material layer comprises depositing said conformal dielectric material layer via chemical vapor deposition.

According to embodiments of this presentation, said coating the active face of said at least one semiconductor chip with the conformal dielectric material layer comprises depositing said conformal dielectric material layer via physical vapor deposition.

According to embodiments of this presentation, said coating the active face of said at least one semiconductor chip with the conformal dielectric material layer comprises a spray coating process; or an atomic layer deposition process; or a plasma deposition process.

According to embodiments of this presentation, said removing the conformal dielectric material layer from at least a portion of said at least one connection pad comprises oxygen plasma etching said conformal dielectric material layer from at least said portion of said at least one connection pad.

According to embodiments of this presentation, said providing at least one semiconductor chip having an active face with at least one connection pad comprises contacting said connection pad and testing that said chip is functional.

According to embodiments of this presentation, said coating the active face of said at least one semiconductor chip with the conformal dielectric material layer comprises fluidly sealing said at least one connection pad of said at least one semiconductor chip with the conformal dielectric material layer.

According to embodiments of this presentation, said conformal dielectric material layer comprises parylene.

Embodiments of this presentation also comprise a process for assembling microelectronic or semiconductor chips, the process comprising: providing at least one semiconductor chip having an active face with at least one connection pad; coating the active face of said at least one semiconductor chip with a conformal material layer, such that said at least one connection pad is completely coated by said conformal material layer; temporarily adhering said active face of said at least one semiconductor chip to a carrier wafer; temporarily adhering the carrier wafer to a wafer with a through-cavity such that said at least one semiconductor chip extends into the through-cavity; assembling said at least one semiconductor chip to the wafer with the through-cavity by filling the through cavity with a heat spreader material, wherein said filling the through-cavity comprises bringing an electrodeposition solution in contact with a backside of said at least one semiconductor chip and with the conformal material layer, and wherein said electrodeposition solution does not chemically react with said conformal material layer; releasing the assembled at least one semiconductor chip and wafer with the through-cavity from the carrier wafer; removing the conformal material layer from at least a portion of said at least one connection pad; and forming at least one electrical connection to said at least a portion of said at least one connection pad.

According to embodiments of this presentation, the material layer fluidly seals said at least one connection pad from the electrodeposition solution.

According to an embodiment of this presentation, the MECA process can be a packaging process, a wafer-level packaging process, or a multi-chip module packaging process.

According to an embodiment of this presentation, heat spreaders are formed and heat spreader residues formed on undesirable locations during formation of the heat spreader are prevented. These undesirable locations can include the active faces (e.g. including pads) of the chips.

According to an embodiment of this presentation, metal underplating (e.g. electrodeposition of metal on and between pads of the chips by, for example, depositing an electrodeposition solution on the pads) and short circuits between pads of chips during the MECA process are prevented by the protection provided for the chips.

These and other features and advantages will become further apparent from the detailed description and accompanying figures that follow. In the figures and description, numerals indicate the various features, like numerals referring to features throughout both the drawings and the description.

BRIEF DESCRIPTION OF THE DRAWINGS

FIGS. 6A-6D show different views of a chip after a MECA process, according to an embodiment of this presentation.

FIGS. 7A and 7B show a cross-sectional view of a chip during a known MECA process.

FIGS. 8A-8C show a cross-sectional view of a chip during a variation of the MECA process diagrammed in FIG. 5, according to an embodiment of this presentation.

FIGS. 9A-9C show a cross-sectional view of a chip during a variation of the MECA process diagrammed in FIG. 5, according to an embodiment of this presentation.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the claimed invention. Additionally, the drawings are not necessarily drawn to scale.

This presentation relates to a method for protecting microelectronic semiconductor chips/die, which can be fabricated separately, during a process for assembling the chips/die with a wafer, which can also be fabricated separately. The assembling process can be referred to as a Metal-Embedded Chip Assembly (MECA) process. Although the process presented herein is described as protecting microelectronic/semiconductor chips during the MECA process, the method presented herein can be used to protect bare die if bare die are used in the MECA process. As used herein, the word "microelectronic chip" or "semiconductor chip" or "chip" or "die" can refer to "bare die."

Figure 1:
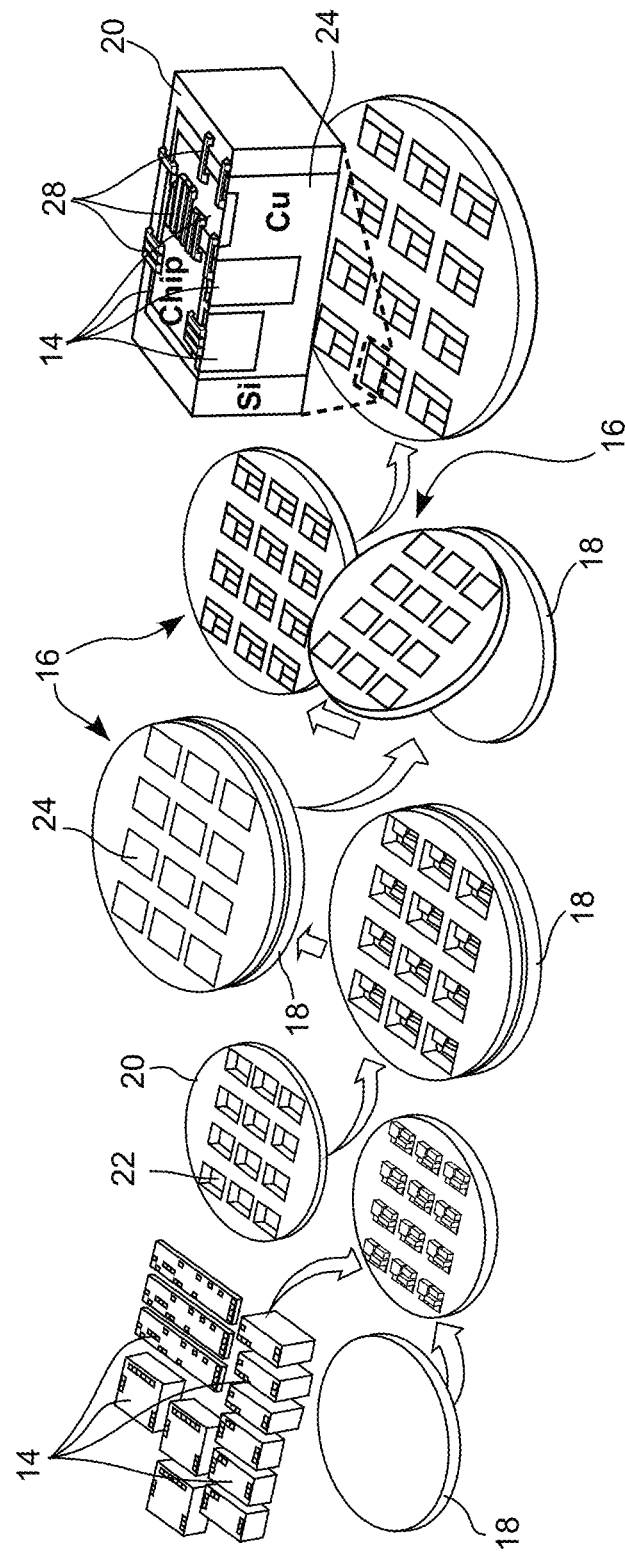
FIG. 1 shows a MECA process, such as used according to an embodiment of this presentation.

FIG. 1 shows a MECA process as used according to an embodiment of this presentation, comprising temporarily mounting microelectronic or semiconductor chips 14 to a carrier wafer 18, with active faces of the chips 14 facing toward the carrier wafer 18. According to an embodiment of this presentation, mounting the chips 14 can comprise adhering the chips 14 to the carrier wafer 18 using, for example, an adhesive layer (not shown). According to an embodiment of this presentation, the chips 14 can be fabricated using different or similar technologies.

According to embodiments of this presentation, and as shown, the MECA process can further comprise temporarily adhering the carrier wafer 18 to a wafer 20 having through-cavities 22, such that the microelectronic or semiconductor chips 14 extend into the through-cavities 22. According to an embodiment of this presentation, and as shown, multiple chips 14 can extend into each through-cavity 22. Adhering the carrier wafer 18 can comprise temporarily bonding the carrier wafer 18 to the wafer 20 with the through-cavities 22 using the adhesive layer (not shown).

According to an embodiment of this presentation, and as shown, the chips 14 can extend into the through-cavities 22 but not beyond the through-cavities. However, in other embodiments, the chips 14 can extend beyond the through-cavities 22. The wafer 20 with the through-cavities 22 can be referred to as an interposer wafer 20. The through-cavities 22 can be etched through the interposer wafer 20.

According to an embodiment of this presentation, the interposer wafer 20 can comprise a dielectric material and/or non-electrically-conducting material. For example, the interposer wafer 20 can be a silicon (Si) wafer, a silicon carbide (SiC) wafer, or an aluminum oxide ($Al_2O_3$) wafer. The interposer wafer 20 is preferably a Si wafer because this Si wafer can integrate more easily with complementary metal-oxide-semiconductor (CMOS) fabrication and can make use of conventional microelectronic processing techniques.

According to embodiments of this presentation, and as shown, the MECA process can further comprise depositing a heat spreader 24 into at least the through-cavities 22, including on the backsides of the microelectronic or semiconductor chips 14. According to an embodiment of this presentation, depositing the heat spreader 24 can be performed so that the heat spreader 24 preferably fills any empty spaces between the chips 14, and between the chips 14 and the interposer wafer 20 to thereby define an assembly 16 of the interposer wafer 20, the heat spreader 24, and the chips 14. According to an embodiment of this presentation, the chips 14 are preferably embedded in the heat spreader 24 by the heat spreader formation process.

According to an embodiment of this presentation, the heat spreader 24 can be a metallic heat spreader such as, for example, a copper heat spreader, a metal composite heat spreader, a metal alloy heat spreader, etc. According to an embodiment of this presentation, depositing the heat spreader 24 can comprise forming the heat spreader 24 by electrodeposition along the lateral sides and the backsides of the chips 14. According to an embodiment of this presentation, forming the heat spreader 24 by electrodeposition on the backsides of the chips 14 can comprise electroplating the backsides of the chips 14 until the heat spreader 24 is formed.

According to embodiments of this presentation, and as shown, the MECA process can further comprise releasing the assembly 16 from the carrier wafer 18. Because the assembly 16 can be released from the carrier wafer 18, the carrier wafer 18 may be referred to as a temporary carrier wafer. According to an embodiment of this presentation, and as shown, the MECA process can further comprise orienting the assembly 16 so that the active faces of the chips face toward an upward direction and/or the active faces are accessible. According to embodiments of this presentation, and as shown, the MECA process can further comprise forming electrical connections 28 between the active faces of the chips 14. As shown, the electrical connections can be formed between the active faces of the chips 14 and the interposer wafer 20.

According to an embodiment of this presentation, the electrical connections 28 can be gold (Au), or copper, or aluminum, electrical connections. According to an embodiment of this presentation, the electrical connections 28 can be single-layer bridge Au electrical connections. According to an embodiment of this presentation, the electrical connections 28 can form chip-to-chip, chip-to-wafer (in case the interposer wafer 20 comprises some electrical circuits that can be connected to the chips 14), and eventually intra-chip electrical connections, if needed, such that the microelectronic or semiconductor chips 14 are electrically connected.

In a MECA process, the active faces of the chips 14 generally face toward the adhesive layer after mounting the chips 14 to the carrier wafer 18. In general, this adhesive layer protects the active faces of the chips 14 during the electrodeposition of the heat spreader 24. For example, the adhesive layer generally prevents the metal used to form the heat spreader 24 from electro-depositing on the active faces of the chips 14.

However, the Inventors have noted that in some instances the adhesive layer does not effectively protect the active faces of the chips 14. As detailed hereafter, experiments showed evidence of a degradation of the chips 14 near their edges when depositing the heat spreader 24. As detailed hereafter, a degradation was for example observed when contact pads (to be shown hereafter) of the chips 14 were located near edges of the chips 14.

Figure 2A:
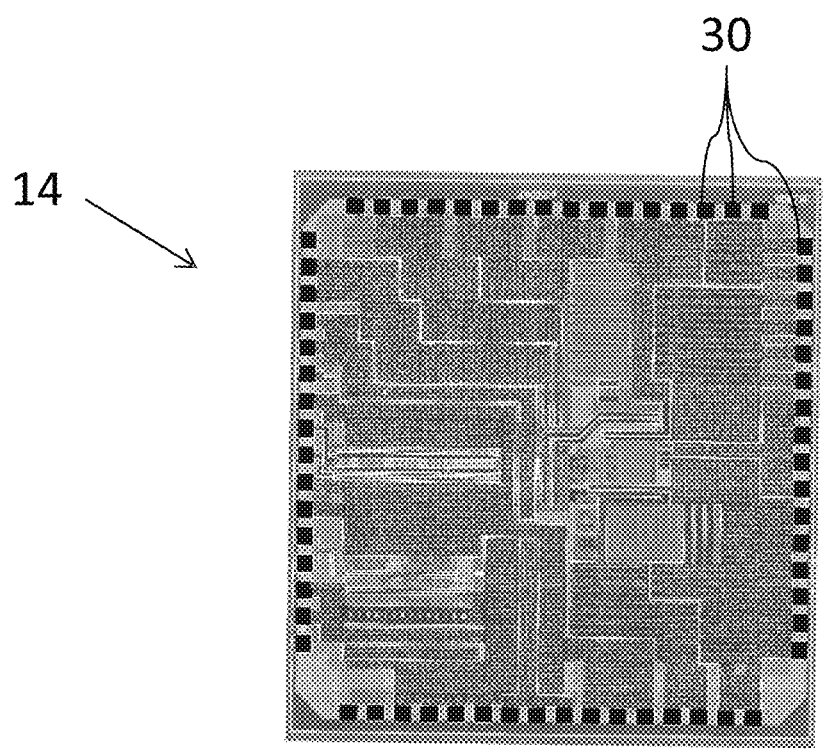
FIGS. 2A and 2B respectively show microscope photos of a CMOS chip with exposed aluminum pads before and after a MECA process such as illustrated in FIG. 1.
Figures 2B, 2C:
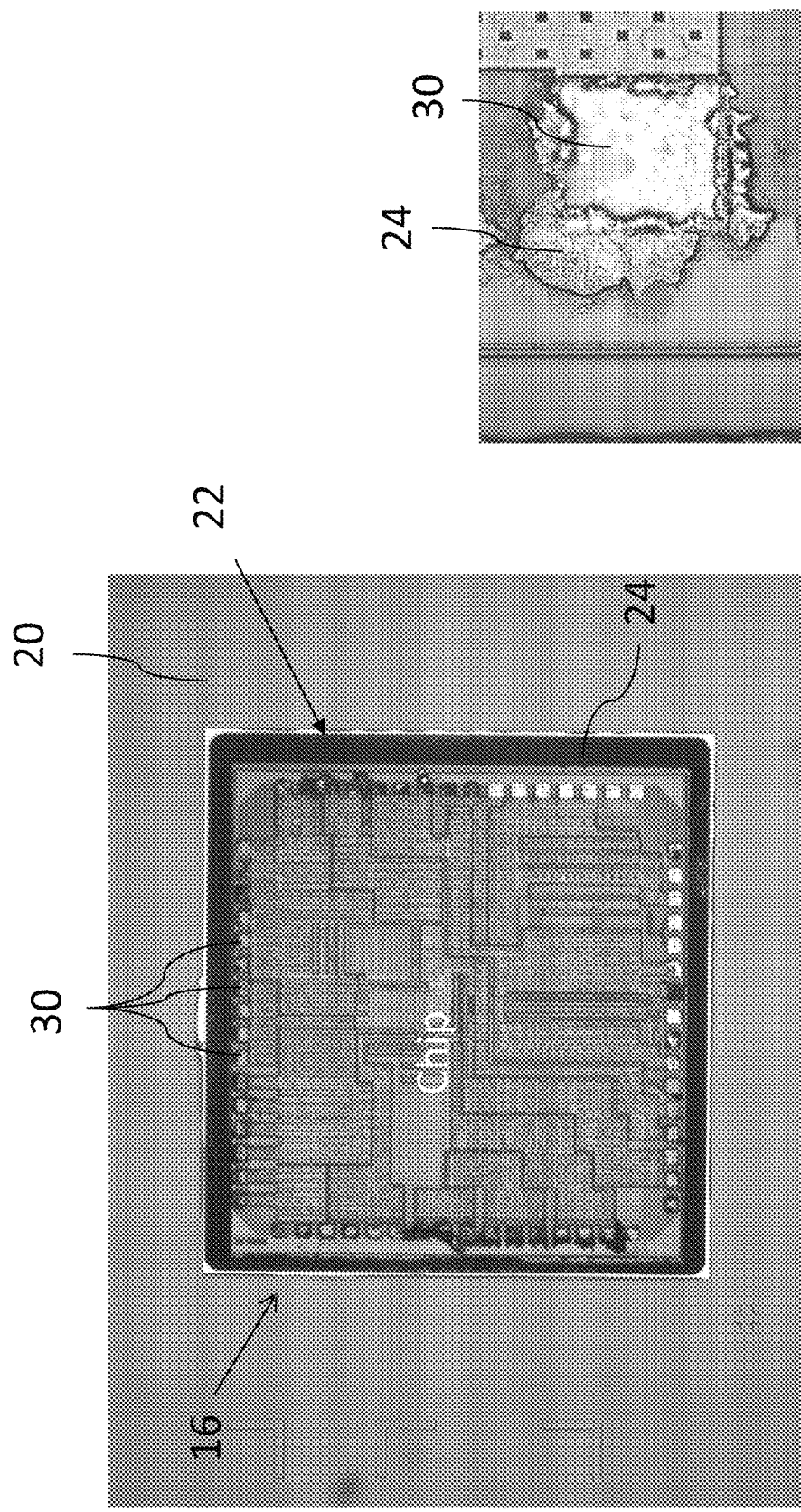
FIG. 2C shows an enlarged view of a portion of FIG. 2B.

FIGS. 2A and 2B respectively show microscope photos of a CMOS chip 14 (a single chip 14 is illustrated for clarity) with exposed aluminum pads 30 (contact pads and/or bonding pads) before and after a MECA process that comprised forming a heat spreader 24 by electrodeposition on a backside of the chip 14. As can be seen in FIG. 2C, which shows an enlarged view of a portion of FIG. 2B, some aluminum pads 30 of chip 14 were detrimentally affected by the electrodeposition when forming the heat spreader 24, the electrodeposition forming a conductive layer around the pads 30. FIGS. 2B and 2C show that the MECA process can result in damage to the pads of the CMOS chip 14. Therefore, according to an embodiment of this presentation, and as detailed hereafter, the MECA process can be improved upon by preventing the damage to the pads of the chip 14.

In the MECA process, in order to form the heat spreader by electrodeposition the backside of the chips, an electrodeposition solution is brought in contact with the backside of the chips. The inventors have noted that if the electrodeposition solution comes into contact with a metal pad such as an aluminum pad 30 at least one of two things can occur. First, the metal pad 30 can be etched due to the electrodeposition solution being acidic or basic, or because there is an electrochemical reaction between the metals (e.g. a reaction between the metal element of the electrodeposition solution and the metal of the metal pad 30). Secondly, (as illustrated in FIG. 2B a space between neighboring or adjacent metal pads 30 can be electroplated with the heat spreader metal up to a point where a short circuit is formed between neighboring or adjacent metal pads. This formation process of a short circuit can be referred to as underplating.

Figure 3:
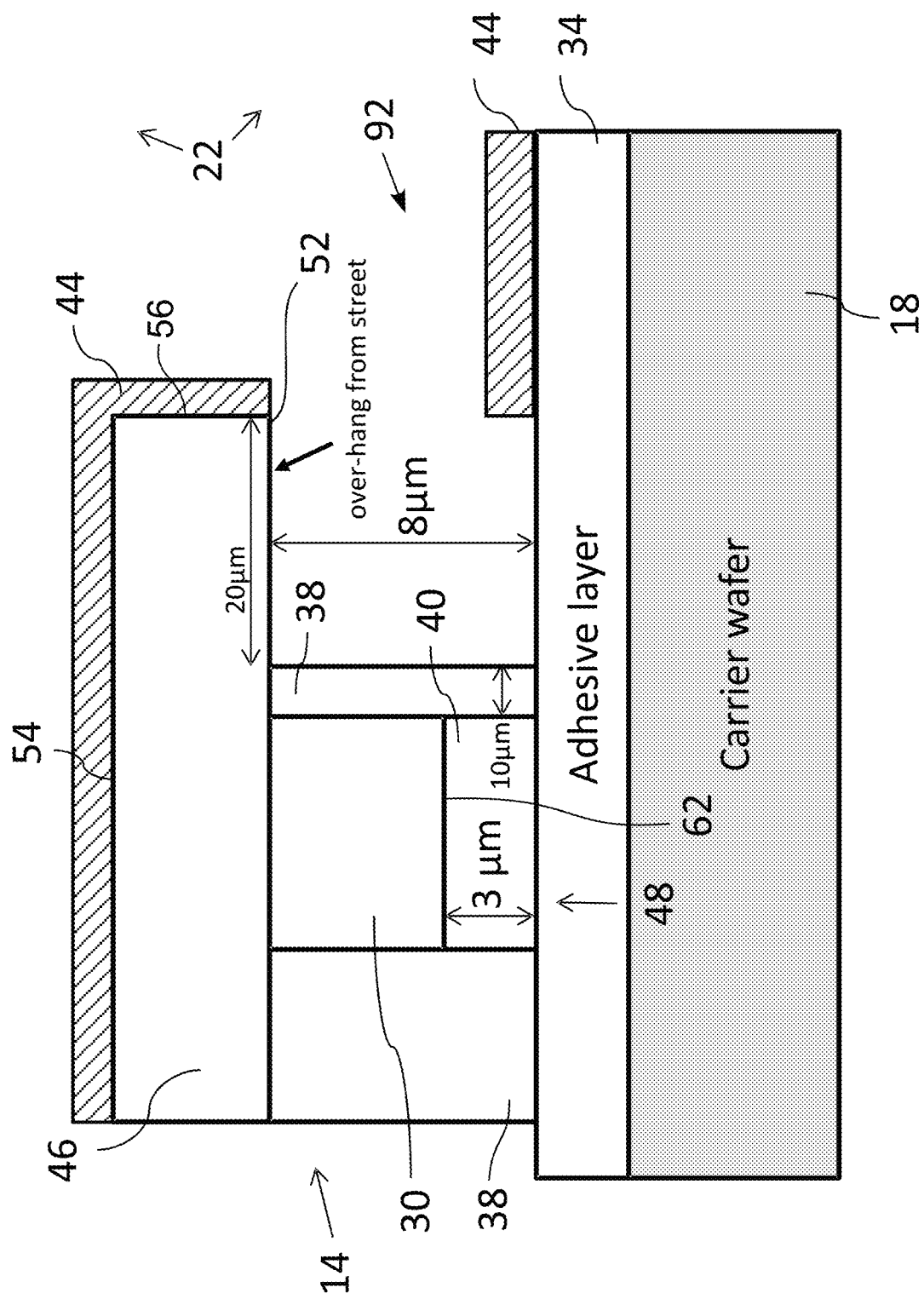
FIG. 3 shows a cross-sectional view of a chip, a carrier wafer, a membrane, and an adhesive layer, such as used in the MECA process illustrated in FIG. 1.

FIG. 3 shows in detail a cross-sectional schematic view of a portion of a chip 14 attached to a carrier wafer 18 during the formation by electrodeposition of a heat spreader 24 (not shown in a MECA process as described in relation with FIG. 1. As illustrated, the chip 14, can comprise a number of pads 30 (for simplicity, only one pad 30 is shown in FIG. 3) on a portion of an active face 48 of a chip wafer 46. According to an embodiment of this presentation, the pads 30 can be metallic (e.g. aluminum) pads. According to an embodiment of this presentation, the chip wafer 46 can be made out of a semiconductor material and its active face 48 can comprise an integrated circuit (not shown) coupled to pad 30.

A dielectric passivation layer 38 (formed during the fabrication of chip 14) covers most of the active face 48 of the chip wafer 46 for protection of any integrated circuit formed on the active face 48, except where the pads 30 are located so as to allow a subsequent electrical connection to the pads. The Inventors have noted that passivation layer 38 is sometimes not present near the edges 52 of the chip wafer 46. For example, the Inventors have noted that an area of the order of 20 micrometers wide can run along the edges 52 of the chip wafer 46, which is not covered by passivation layer 38. This area may not be covered by passivation layer 38 because, for example, during a typical fabrication of the chip 14, a plurality of chips 14, arranged in a rectangular array or grid, are fabricated on a common semiconductor wafer (from which chip wafer 46 can be formed). Areas on the order of 40 micrometers wide, known as "streets", separate each of the plurality of chips 14 from the chips 14 adjacent to it in the array or grid. One purpose of the streets is to accommodate the loss of common semiconductor wafer material during dicing of the common semiconductor wafer. Dicing accomplishes the physical separation of the plurality of chips 14 from one another. Prior to dicing, the streets may not be covered by passivation layer 38, in order to prevent, for example, cracking of the chips 14 (including of their active faces) during dicing. When the common semiconductor wafer is diced, areas on the order of 20 micrometers wide that are not covered by passivation layer 38 can run along the edges 52 of the chip wafers 46 of the plurality of chips 14.

The chip 14 is here shown after temporarily adhering the chip 14 to a carrier wafer 18 using an adhesive layer 34, with the active face 48 of the chip 14 facing toward the carrier wafer 18. As illustrated in FIG. 3, a heat spreader can be created/formed by first forming on a backside 54 of the chip wafer 46 a conductive membrane 44. The membrane 44, which can be a metal membrane (e.g. sputtered) also forms on sidewalls 56 of the chip wafer 46 and on the adhesive layer 34. As detailed in relation with FIG. 1, chip 14 can be, at the time of the forming of membrane 44, located in a through-cavity 22 of a wafer 20 (not shown in FIG. 3) and the membrane 44 can also be deposited on the walls (not shown) of the through-cavity 22. In some embodiments, the heat spreader (24 in FIG. 1) can comprise the membrane 44.

The Inventors have noted that, because the passivation layer 38 does not cover all of the active face 48 of chip wafer 46, in particular does not cover a region or area along the edges 52 of chip wafer 46, the sidewalls 56 of wafer 46 can form an overhang above the adhesive layer 34 when the passivation layer 38 is brought into contact with the adhesive layer. The inventors have noted that the overhang can for example extend laterally up to 20 micrometers. The Inventors have also noted that with a plurality of the technologies (including sputtering, as outlined previously) used to form membrane 44, when such an overhang exists, a gap 92 can appear in membrane 44 between the sidewalls 56 of the chip wafer 46 and the surface of the adhesive layer 34 when forming the membrane 44, due to an inability of the process to deposit the membrane 44 below the overhang. According to an embodiment of this presentation, the gap 92 can be approximately 8 micrometers wide.

Membrane 44 can comprise an electrically conductive material, for example metal such as titanium (Ti)/platinum (Pt)/gold (Au), deposited by sputtering in that order. The membrane 44 can be 100-500 nanometers (nm) in thickness, and preferably 200 nm, according to an embodiment of this presentation.

Further, the Inventors have noted that the pads 30 may, as an intentional or unintentional result of the process used to manufacture chip 14, be recessed into the dielectric passivation layer 38 (for example by as much as 3 micrometers for a dielectric passivation layer 38 approximately 3 micrometers thick) to form a recess 40. Further, the pads 30 can be rather close to the edge 52 of the chip wafer 46, and can therefore be very close to the edges of passivation layer 38 (for example the width of the dielectric passivation layer 38 between a pad 30 and the edge of passivation layer 38 can be of the order of 10 micrometers)

As outlined previously, in a MECA process the heat spreader 24 can be formed by electrodeposition starting from membrane 44. The inventors have noted that when doing so, the electrodeposition solution of the process (for example a copper electrodeposition solution) flows through the gap 92 in membrane 44 and comes in contact with the edges of passivation layer 38. Because, as outlined above, the pads 30 can be very close to the edges of passivation layer 38, the electrodeposition solution can further leak between the passivation layer 38 and the adhesive layer 34, and enter in contact with the pads 30. As outlined above, the contact of pads 30 with the electrodeposition solution can lead to damaging the pads, and/or short circuiting neighboring pads by forming a metallic layer between them, and; short circuiting the pads to the heat spreader by forming a metallic layer between them. It is noted that membrane 44 can be optional in the MECA process In such occurrence, the problem due to the flowing of the electrodeposition solution under the overhang is exacerbated.

Figure 4:
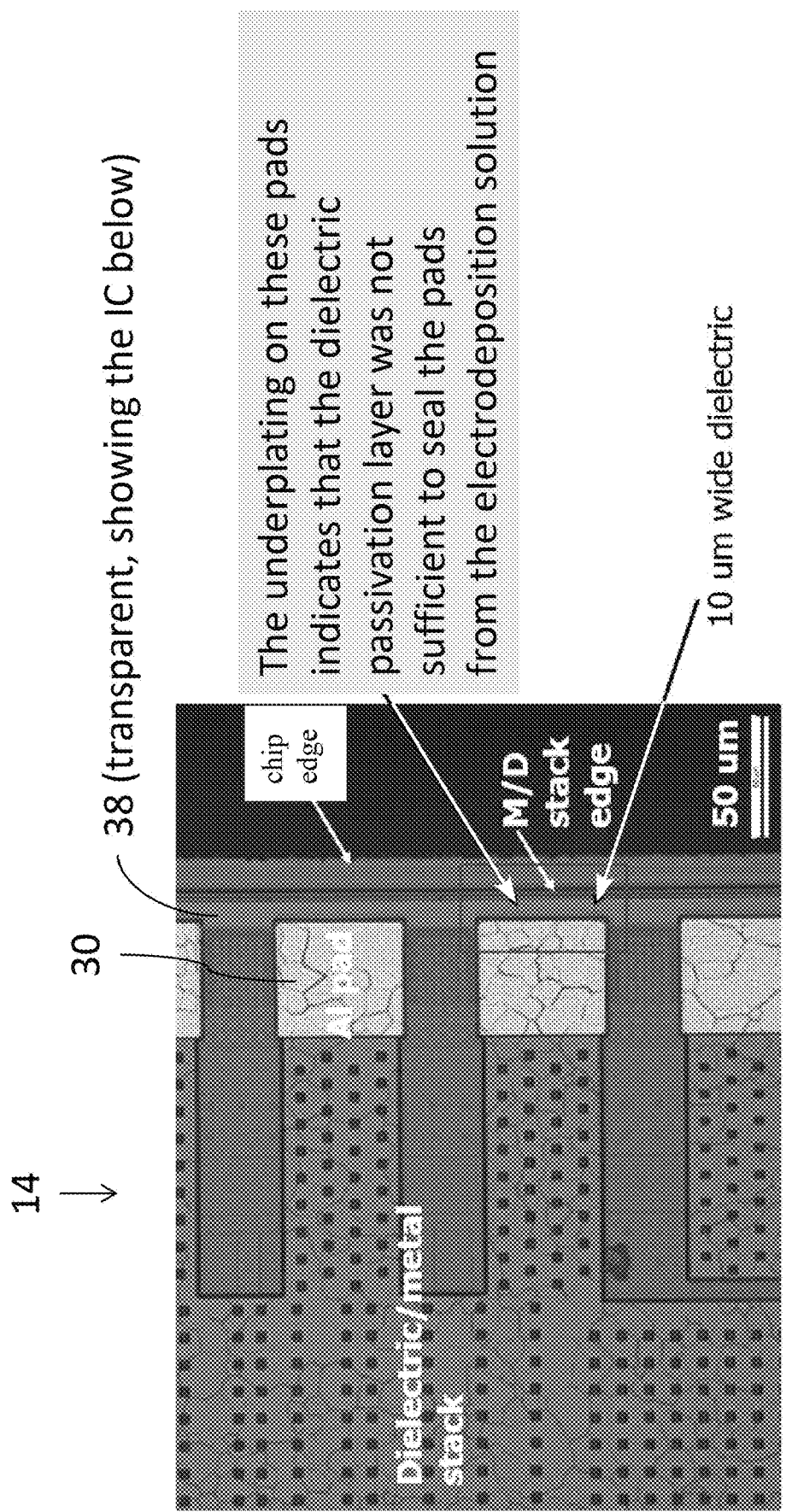
FIG. 4 shows a view of a portion of a CMOS chip such as illustrated in FIG. 3.

FIG. 4 shows an enlarged top view of a detail of a CMOS chip 14 highlighting the metal and dielectric stack and chip edge.

One solution to prevent damage to the pads by the electrodeposition process can be to not remove the passivation layer 38 from the chips 14before temporarily attaching the chips 14 to carrier wafer 18 using the adhesive layer 34; then form the heat spreader 24 to attach the chips 14 to the wafer 20 and, then only, remove the passivation layer 38 from above the pads 30 so that, for example, at least one electrical connection 28 to the pads 30 can be formed. However, the Inventors have determined that such late partial removal of the dielectric passivation layer 38 may not be suitable, at least because not removing the passivation layer 38 prior to attaching the chips 14 to the adhesive layer 34 prevents from testing the chips 14 for pre-existing electrical defects. According to an embodiment of this presentation, the chips 14 are pre-screened and/or electrically tested to identify if the chips 14 are Known Good Die before the chips 14 are integrated into the assembly 16. Therefore, according to an embodiment of this presentation, the pads 30 of the chips 14 preferably comprise exposed surfaces (62 in FIG. 3) so that the pads 30 are electrically probeable and/or accessible, before adhering the chips 14 to the carrier wafer 18.

Another solution to prevent damage to the pads by the electrodeposition process can be to move the pads 30 of chips 14 inward, so that there, is enough width between the pads 30 and the nearest edge of the passivation layer 38, in the hope that the temporary attachment of the passivation layer 38 to the adhesive layer 34 will provide a fluid seal sufficient to prevent the electrodeposition solution from reaching the pads 30 during the electrodeposition process. However, the Inventors have noted that such moving the pads of chips 14 inward detrimentally reduces the available real estate of chips 14, and lengthens connections between the pads and the outside of the chips 14.

According to an embodiment of this presentation, the MECA process can comprise temporarily protecting or passivating the active face of the chip 14 such that said at least one connection pad 30 on the active face of the chip 14 is completely covered by a conformal material layer. According to an embodiment of this presentation, temporarily protecting or passivating the active face of the chip 14 can prevent damage to the pads (e.g. by the electrodeposition process). According to an embodiment, at least all the connection pads 30 arranged on a periphery of the chip 14 are protected by the conformal material layer. According to an embodiment, all the connection pads 30 of the chip 14 are protected by the conformal material layer. According to an embodiment, all of the active face of the chip 14 is protected by the conformal material layer. According to an embodiment of this presentation, once the chips 14 are temporarily protected (or passivated) by the conformal material layer, the chips 14 can be handled with minimal care without incurring chip degradation, and without running the risk of affecting the pads 30 with the electrodeposition process when forming the heat spreader 24.

Furthermore, because a process according to this presentation can be applied to any microelectronic or semiconductor chips 14, regardless of the materials from which they are fabricated, their form factor, or any circuitry they contain, options for packaging the chips 14 are increased and design rules are relaxed. Specifically, a process according to this presentation makes it possible to have pads 30 close to the edges of the chips 14, on a periphery of the chip 14, which allows to minimize or reduce the size of the final assembly and also to minimize or reduce the lengths of any desired electrical connections between chips 14 (thus for example reducing power loss through these electrical connections).

Figure 5:
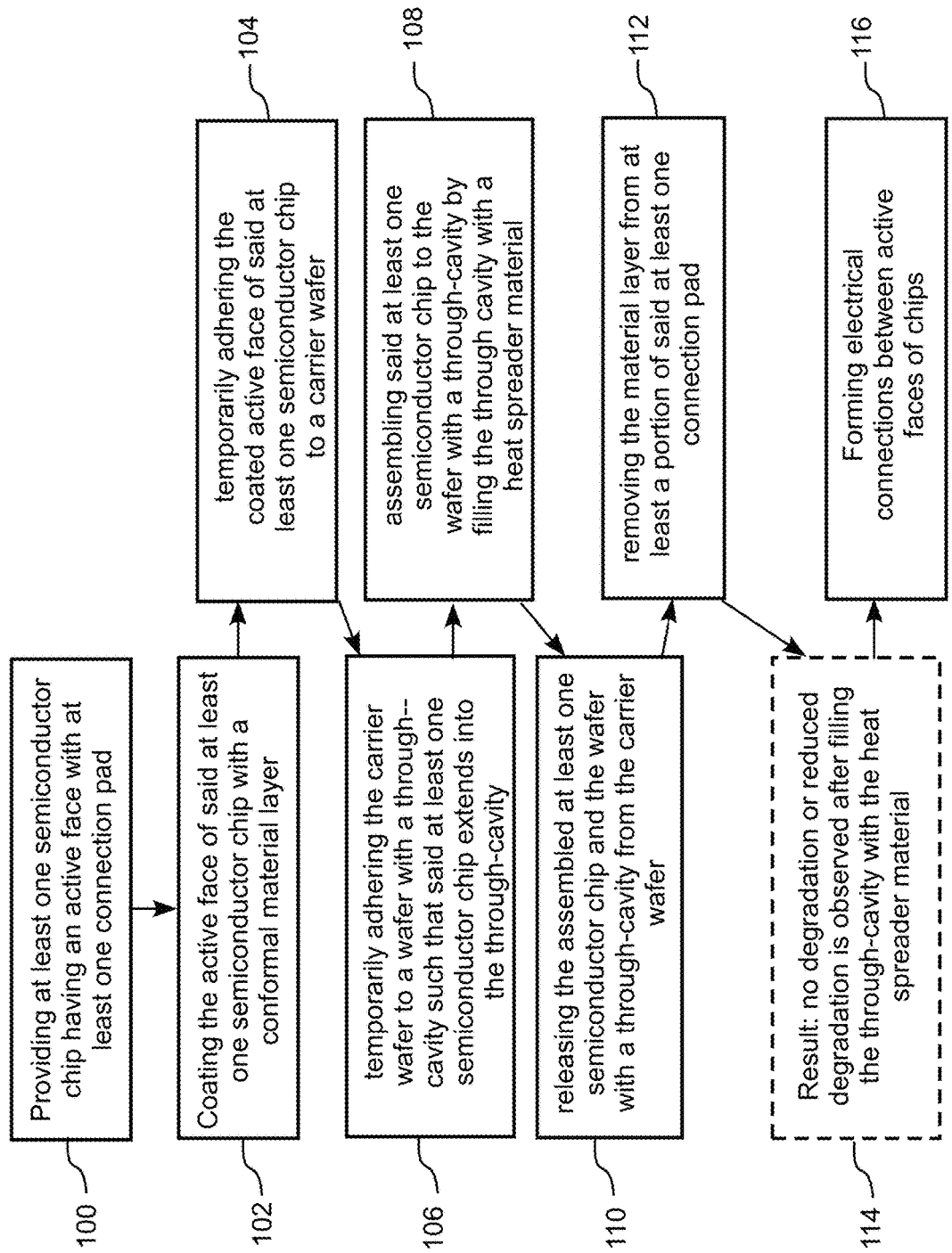
FIG. 5 shows a flow diagram of a MECA process, according to an embodiment of this presentation.

FIG. 5 shows a flow diagram of a MECA process, according to an embodiment of this presentation, comprising providing 100 at least one semiconductor chip (e.g. 14 in FIGS. 8A-C) having an active face with at least one connection pad (e.g. 30 in FIGS. 8A-C). According to an embodiment of this presentation, and as shown in FIG. 5, the MECA process can further comprise coating 102 at least the active face of said at least one semiconductor chip 14 with a conformal material layer (e.g. 50 in FIGS. 8A-C) to protect or passivate the active face such that the at least one connection pad 30 is completely coated by the conformal material layer. According to an embodiment, the conformal material layer 50 can be a conformal dielectric material layer. According to an embodiment, the conformal material layer 50 can alternatively be a conformal metal layer as long as the conformal metal layer is compatible with the process and can be selectively removed/etched away without degrading the aluminum pads 30.

According to an embodiment, said coating can comprise coating the totality of the active face of said at least one semiconductor chip 14 with the material layer 50 to, for example, fluidly seal the active face including the at least one pad 30 of the chip 14.

According to an embodiment of this presentation, and as shown, the MECA process can further comprise temporarily adhering 104 the coated active face of the semiconductor chip 14 to a carrier wafer (e.g. 18 in FIGS. 8A-C).

According to an embodiment of this presentation, and as shown, the MECA process can further comprise temporarily adhering 106 the carrier wafer 18 to a wafer (e.g. 20 in FIGS. 8A-C) with a through-cavity (e.g. 22 in FIGS. 8A-C) such that the semiconductor chip 14 extends into the through-cavity 22. The wafer 20 with the through-cavity 22 can be a wafer 20 with a plurality of through-cavities 22, according to an embodiment of this presentation. The at least one semiconductor chip 14 can comprise a plurality of semiconductor chips 14 having each an active face with at least one connection pad 30, according to an embodiment of this presentation According to an embodiment of this presentation, temporarily adhering 106 the carrier wafer 18 to the wafer 20 with the through-cavity 22 can comprise temporarily adhering the carrier wafer 18 to the wafer 20 with the plurality of through-cavities 22 such that the plurality of chips 14 extends into the through-cavities 22. According to an embodiment of this presentation, multiple chips 14 can extend into each through-cavity 22.

According to an embodiment of this presentation, and as shown, the MECA process can further comprise assembling 108 said at least one semiconductor chip 14 to the wafer 20 with the through-cavity 22 by filling the through cavity 22 with a heat spreader material (e.g. 24 in FIGS. 8B-C)

According to an embodiment of this presentation, filling the through cavity 22 with the heat spreader material 24 can comprise covering the backside and/or sidewalls of the at least one chip 14 with the heat spreader material 24. If more than one chip 14 is used in the MECA process, filling the through cavity 22 with the heat spreader material 24 can comprise covering the backsides and/or sidewalls of the chips 14 with the heat spreader material 24. Filling the through cavity 22 with the heat spreader material 24 can result in embedding the chips 14 in the heat spreader material 24, for example, such that the active faces of the chips 14 are essentially flush with a surface of the wafer 20. This allows for integrated heat spreaders and multi-chip integration in the wafer 20. It is noted that a subsequent removal of the conformal material layer 50 (preferably a dielectric) can result in slightly recessing the active face of the chip 14 below the surface of the wafer 20.

According to an embodiment, filling the through cavity 22 with the heat spreader material 24 can comprise bringing an electrodeposition solution (not shown) in contact with the backside of the chip 14, sidewalls of the chip 14, and/or portions of the material layer 50 that coat the active face of the chip 14, Preferably, the material layer 50 conformally coats the active face, to fluidly seal the active face, including the at least one pad 30, of the chip 14, from the electrodeposition solution.

According to an embodiment of this presentation, and as shown, the MECA process can further comprise releasing 110 the assembled at least one semiconductor chip 14 and wafer 20 with the through-cavity 22 from the carrier wafer 18.

According to an embodiment of this presentation, and as shown, the MECA process can further comprise removing 112 the material layer 50 from at least a portion of said at least one connection pad 30. Removing the material layer 50 can alternatively comprise removing the material layer 50 from the all of the active face of the chip 14.

As outlined above, according to an embodiment of this presentation, coating the active face of the chip 14 can comprise conformally coating the active face of the chip 14 with the conformal material layer 50.

According to an embodiment of this presentation, when the material layer 50 coats the active face of the chip 14, no degradation or a reduced degradation of the active face including the at least one pad 30 due to electroplating as detailed here above can be observed 114 after releasing the assembled chip 14 and wafer 20 with the through-cavity 22. This is at least because the material layer 50 can protect or passivate the active face including the at least one pad 30 of the chip 14 while filling the through cavity 22 with the heat spreader material 24.

According to an embodiment of this presentation, and as shown, the MECA process can further comprise forming 116 at least one electrical connection 28 to said at least said portion of said at least one connection pad 30. If more than one chip 14 is used in the MECA process, forming 116 the at least one electrical connection 28 can comprise forming at least one electrical connection 28 between the active faces of the chips 14.

According to an embodiment of this presentation, a thickness of the material layer 50 can be less than 2 micrometers (e.g. 0.1-2 micrometers or 0.5-2 micrometers), 0.1 to less than 10 micrometers, less than 0.5 micrometers, less than 1 micrometer, or less than 10 micrometers.

According to an embodiment of this presentation, if an electrodeposition solution is used, the material layer 50 can be a material layer 50 that does not chemically react with the electrodeposition solution during filling the through cavity 22 with the heat spreader material 24. For example, the material layer 50 can be a dielectric material layer 50. The dielectric material layer 50 can comprise a metal oxide, parylene, epoxy, and/or a photoresist. According to an embodiment of this presentation, the metal oxide can be aluminum oxide ($Al_2O_3$). According to an embodiment of this presentation, the epoxy can be for example an SU-8 epoxy. According to an embodiment of this presentation, the photoresist can be for example an AZ4620 photoresist or an S1815 photoresist.

According to an embodiment of this presentation, the dielectric material layer 50 can comprise a layer of the metal oxide, a layer of parylene, a layer of epoxy, and/or a layer of the photoresist.

According to an embodiment of this presentation, if the dielectric material layer 50 comprises photoresist and/or epoxy, coating the active face of the chip 14 can comprise curing the photoresist and/or epoxy.

According to an embodiment of this presentation, conformally coating the active face of the chip 14 can comprise coating the active face of the chip 14 via an atomic layer deposition of the dielectric material layer 50 on the active face of the chip 14. The atomic layer deposition can be an atomic layer deposition of the metal oxide. The metal oxide is preferably aluminum oxide since aluminum oxide can be deposited conformally via atomic layer deposition at room temperature, and can be easily removed, for example, by etching (e.g. dry and/or wet etching).

Conformally coating can comprise spray coating the active face of the chip 14 with the dielectric material layer 50. The spray coating can be a spray coating of the active face of the chip 14 with photoresist and/or epoxy. The spray coating can be conducted at a temperature lower than 100° C., and in some embodiments, at a temperature lower than 70° C.

In addition, conformally coating can comprise spin coating the active face of the chip 14 with the dielectric material layer 50. The spin coating can be a spin coating of the active face with epoxy and/or photoresist.

In addition, conformally coating can comprise dip coating the active face of the chip 14 with the dielectric material layer 50. The dip coating can be a dip coating of the active face with epoxy and/or photoresist.

According to an embodiment of this presentation, conformally coating the active face of the chip 14 can comprise drop-casting the dielectric material layer 50 onto the active face of the chip 14. The drop-casting can be a drop-casting of epoxy and/or photoresist onto the active face of the chip 14.

According to an embodiment of this presentation, conformally coating the active face of the chip 14 can comprise coating the active face of the chip 14 via a plasma deposition of the dielectric material layer 50 on the active face of the chip 14. The plasma deposition can be a plasma enhanced chemical vapor deposition or a physical vapor deposition.

According to an embodiment of this presentation, conformally coating the active face of the chip 14 can comprise coating the active face of the chip 14 via a chemical vapor deposition of the dielectric material layer 50 on the active face of the chip 14. The chemical vapor deposition can be a chemical vapor deposition of parylene. The parylene can be parylene C and the chemical vapor deposition of parylene C can be conducted at a temperature equal to or less than 100° C. (e.g. room temperature); this would result in no negative effect on the dielectric material layer 50, and therefore, on the at least one connection pad 30 of the chip 14 since parylene C begins to degrade at a temperature greater than around 100° C.

According to an embodiment of this presentation, the chemical vapor deposition can be a chemical vapor deposition of the dielectric material layer 50 on the active faces of a plurality of chips 14. The plurality of chips 14 can comprise two chips 14 or more, three chips 14 or more, or hundreds or even thousands of chips 14 or more, according to embodiments of this presentation. If the dielectric material layer 50 comprises parylene, conformally coating the active faces of the plurality of chips 14 with parylene can comprise coating the active faces of the plurality of chips 14 simultaneously, for example, via the chemical vapor deposition of parylene.

A form factor of the chip 14 can include the size and/or thickness of the chip 14, and the chemical vapor deposition of the dielectric material layer 50 is generally not constrained by the form factor of the chip 14. The inventors have noted that coating the active face of the chip 14 via chemical vapor deposition gives satisfactory results for any form factor of the chip 14.

According to an embodiment of this presentation, the MECA process can further comprise coating also the sidewalls of the chip 14 with the material layer 50. If the sidewalls of the chip 14 are coated by the material layer 50, filling the through cavity 22 with the heat spreader material 24 can comprise covering, with the heat spreader material 24, portions of the material layer 50 that coat the sidewalls of the chip 14.

According to an embodiment of this presentation, coating the sidewalls of the chip 14 can comprise depositing the material layer 50 onto the sidewalls of the chip 14.

According to an embodiment of this presentation, coating the active face of the chip 14 can comprise coating the at least one connection pad 30 of the chip 14 with the material layer 50. Coating the at least one connection pad 30 of the chip 14 can comprise completely coating the at least one connection pad 30 of the chip 14 (as well as an area surrounding the connection pad such that the connection pad is fluidly sealed from e.g. an electrodeposition fluid) with the material layer 50. According to an embodiment of this presentation, the at least one pad 30 can be at least one recessed pad if the at least one pad 30 is recessed into, for example, a dielectric passivation layer (shown in FIG. 3).

According to an embodiment of this presentation, the outer surfaces (including e.g. the active face) of the chip 14 can comprise dielectric material and/or metallic material, and the MECA, process can further comprise coating said dielectric material and/or metallic material of the outer surfaces of the chip 14 with the material layer 50, According to an embodiment of this presentation, the conformal material layer 50 can conform to the active face of the chip 14, and/or to the at least one pad 30.

According to an embodiment of this presentation, and as detailed hereafter, the material layer 50 is preferably sufficiently thin to not impede forming e.g. an electrical connection 28 to the active face of the chip 14 if the layer 50 is removed from the pads 30.

According to an embodiment of this presentation, if the material layer 50 is a dielectric material layer 50, the dielectric material layer 50 can be transparent (e.g. transparent to visible light or to UV or to IR), which can be advantageous during the step of temporarily adhering the coated active face of the at least one chip to the carrier wafer 18, since for example this step can comprise aligning the at least one chip 14 on the carrier wafer 18 according to the location of the at least one pad of the chip 14 in relation to the carrier wafer 18. The dielectric material layer 50 can be transparent if for example the dielectric material layer 50 is a layer of parylene.

According to an embodiment of this presentation, the material layer 50 can comprise a metal and/or a metal layer (e.g. among other layers), which can dissipate heat during operation. If an electrodeposition solution is used, the metal and/or metal layer can be selected so that the material layer 50 does not chemically react with the electrodeposition solution during filling the through cavity 22 with the heat spreader material 24. For example, the material layer 50 can comprise titanium to prevent the electrodeposition of the heat spreader 24 on the material layer 50. Portions of the material layer 50 must of course be removed alter the formation of the heat spreader 24 so that the pads 30 are not short-circuited by the material layer 50 in the final structure. Alternatively, material layer 50 can comprise TiN or TaN.

According to an embodiment of this presentation, coating the active face of the chip 14 can comprise sputtering the metal and/or metal layer on the active face of the chip 14. According to an embodiment of this presentation, if the material layer 50 comprises a metal and/or metal layer, a surface of the metal and/or metal layer can be oxidized so that the electrodeposition of the heat spreader 24 on the material layer 50 is prevented. According to an embodiment of this presentation, if the material layer 50 comprises a metal layer, the metal layer can be oxidized so that the electrodeposition of the heat spreader 24 on the material layer 50 is prevented.

According to an embodiment of this presentation, and as previously stated, removing the material layer 50 can be performed before forming said at least one electrical connection 28 to said at least said portion of said at least one connection pad 30. As outlined previously, according to an embodiment of this presentation, removing the material layer 50 can comprise selectively removing the material layer 50 from at least a portion of said at least one connection pad.

According to an embodiment of this presentation, removing the material layer 50 can comprise etching the material layer 50. Etching the material layer 50 can comprise selectively etching the material layer 50.

If the material layer 50 is a dielectric material layer 50, selectively etching and/or selectively removing the dielectric material layer 50 can comprise plasma etching the dielectric material layer 50. According to an embodiment of this presentation, plasma etching the dielectric material layer 50 can comprise oxygen ($O_2$) and Fluoroform ($CHF_3$) plasma etching the dielectric material layer 50.

According to an embodiment of this presentation, plasma etching the dielectric material layer 50 can comprise oxygen ($O_2$) plasma etching the dielectric material layer 50. Plasma etching the dielectric material layer 50 can comprise placing the assembled at least one semiconductor chip 14 and wafer 20 with the through-cavity 22 in an oxygen ($O_2$) plasma etcher to plasma etch the dielectric material layer 50. Oxygen plasma etching is compatible with the MECA process at least since it has no negative effect on many dielectric, semiconductor, and metallic materials, which the at least one chip 14 can comprise. For example, by oxygen plasma etching the dielectric material layer 50, inadvertently etching the chip 14 (e.g. the pad 30 or dielectric material thereof) can be prevented.

FIGS. 6A-6D show different views of a chip 14 after a MECA process, according to an embodiment of this presentation, comprising providing the chip 14 having an active face with at least one connection pad 30, coating the active face of the chip 14 with a conformal dielectric material layer 50 such that said at least one connection pad 30 (a plurality of pads 30 illustrated) is completely coated by said conformal dielectric material layer 50, assembling the chip 14 to a wafer 20 with a through-cavity 22 by filling the through cavity 22 with a heat spreader material 24, wherein the assembling step comprises electrodepositing the heat spreader material 24 on a backside of the chip 14, and removing the conformal dielectric material layer 50 from at least a portion of said at least one connection pad. As shown, the at least one pad 30 of the active face of the chip 14 was not etched or electroplated by the electrodeposition solution because the at least one pad 30 was protected or passivated by the dielectric material layer 50.

FIGS. 7A and 7B show a cross-sectional view of a chip 14 during a known MECA process. Known MECA processes do not comprise coating the active face of the chip 14 with a dielectric material layer 50 such that the connection pads of the chip are completely coated by said conformal dielectric material layer. FIG. 7A shows the chip 14 after temporarily adhering a carrier wafer 18 to a wafer 20 with a through-cavity 22 such that the chip 14 extends into the through-cavity 22, and before assembling said chip 14 to the wafer 20 with the through-cavity 22 by filling the through cavity 22 with a heat spreader material 24. FIG. 7B shows the chip 14 after assembling said chip 14 to the wafer 20 with the through-cavity 22, after releasing the assembled chip 14 and the wafer 20 with the through-cavity 22 from the carrier wafer 18, after orienting the assembled chip 14 and the wafer 20 with the through-cavity 22 so that the active face of the chip 14 faces toward an upward direction, and before forming at least one electrical connection 28 to said portion of said at least one connection pad 30. As shown in FIG. 7B, the active face of the chip 14 is flush with a top surface of the heat spreader material 24 as well as with the top surface of wafer 20.

FIGS. 8A-8C show a cross-sectional view of a chip 14 during a MECA process according to an embodiment of this presentation, as diagrammed in FIG. 5, wherein coating the active face of the chip 14 with a dielectric material layer 50 such that said at least one connection pad is completely coated by said conformal dielectric material layer comprises coating at the same time the active face of the chip 14 with a top dielectric material layer 63 (e.g. parylene and the sidewalls of the chip 14 with the same dielectric material layer (thus forming dielectric material sidewalls 64). According to an embodiment of this presentation, the thickness of the top and side dielectric material layers 63 and 64 is less than 1 micrometer, and said removing the dielectric material layer 50 from at least a portion of at least one connection pad (not labeled) comprises removing the top dielectric material layer 63 from the active face of the chip 14, but not removing the side dielectric material layer 64 from the sidewalls of the chip 14. At this juncture, it is noted that even though side dielectric material layer 64 is illustrated as covering the whole height of the sidewalls of the chip 14, it can alternatively cover only a portion of the height of the sidewalls of the chip 14.

FIG. 8A shows the chip 14 after temporarily adhering the coated chip 14 to a carrier wafer 18 and the carrier wafer 18 to a wafer 20 with a through-cavity 22, such that the chip 14 extends into the through-cavity 22; and before assembling said chip 14 to the wafer 20 with the through-cavity 22 by filling the through cavity 22 with a heat spreader material 24. FIG. 8B shows the chip 14 after assembling said chip 14 to the wafer 20, after releasing the assembled chip 14 and the wafer 20 from the carrier wafer 18, after orienting the assembled chip 14 and the wafer 20 with the through-cavity 22 so that the active face of the chip 14 faces toward an upward direction, and before removing the top dielectric material layer 63 from the active face of the chip 14. FIG. 8C shows the chip 14 after removing the top dielectric material layer 63 from the active face of the chip 14, and before forming an electrical connection to the connection pad.

As shown in FIG. 8C, the chip 14 is recessed into the heat spreader material 24 by a depth approximately equal to the thickness of the removed top dielectric material layer 63, which is less than 1 micrometer. Though the thickness of the top and side dielectric material layers 63 and 64 is less than 1 micrometer in the illustrated embodiment, in other embodiments, the thickness of the first dielectric material layer 63 and/or the thickness of the second dielectric material layer 64 can be less than 2 micrometers, 0.1 to less than 10 micrometers, or less than 0.5 micrometers, which can respectively result in chip recesses of approximately less than 2 micrometers, 0.1 to less than 10 micrometers, or less than 0.5 micrometers, which can be particularly non disruptive to form further electrical connections to the connection pads.

FIGS. 9A-9C show a cross-sectional view of a chip 14 during a variation of the MECA process diagrammed in FIG. 5, according to an embodiment of this presentation, wherein coating the active face of the chip 14 with a dielectric material layer 50 such that the at least one connection pad is completely coated by said conformal dielectric material layer comprises: coating at the same time the active face of the chip 14 with a top layer 63 (of parylene, for example) and the sidewalls of the chip 14 with a side layer 64 of the same material, wherein the thickness of the top and side layers 63 and 64 is approximately 10 micrometers, and wherein removing the dielectric material layer 50 from at least a portion of at least one connection pad (not labeled) comprises removing the top layer 63 from the active face of the chip 14.

FIG. 9A shows the chip 14 after temporarily adhering the coated chip 14 to a carrier wafer 18 and the carrier wafer 18 to a wafer 20 with a through-cavity 22 such that the chip 14 extends into the through-cavity 22, and before assembling said chip 14 to the wafer 20 with the through-cavity 22 by filling the through cavity 22 with a heat spreader material 24. FIG. 9B shows the chip 14 after assembling said chip 14 to wafer 20, after releasing the assembled chip 14 and wafer 20 from the carrier wafer 18, after orienting the assembled chip 14 and the wafer 20 with the through-cavity 22 so that the active face of the chip 14 face toward an upward direction, and before removing the top layer 63 from the active face of the chip 14. FIG. 9C shows the chip 14 after removing the top layer 63 from the active face of the chip 14, and before forming at least one electrical connection to a pad on the active face of the chip 14.

As shown in FIG. 9C, the chip 14 is recessed into the heat spreader material 24 by a depth approximately equal to the thickness of the first dielectric material layer 63, which is preferably smaller than 10 micrometers.

As used herein, the word "parylene" can refer to a member, or a combination of members, of a family of materials, comprising parylene N, parylene C, parylene AF-4, parylene X, parylene VT-4, parylene D, parylene M, parylene E, et cetera. A practitioner can select a member or a combination of members from that family of materials to accommodate their particular set of processes, devices, etc.

The technology herein presented was recently demonstrated on a MECA lot (MECA1) and will be used on future MECA/MECAMIC packaging lots. The word "lot" refers to a group of wafers that are being processed as a group. The term "MECA1" is a name given to a particular lot. The term "MECAMIC" is an acronym for "metal-embedded chip assembly millimeter-wave integrated circuit." In one aspect, the chips can be subjected to a MECA process to form a MECAMIC, wherein the MECAMIC is a multi-chip, high-frequency (millimeter-wave) circuit. In another aspect, the MECAMIC can be designed to operate at high frequencies (e.g. greater than approximately 1 GHz).

The following embodiments are contemplated.

According to an embodiment of this presentation, at least one pad of at least one chip can be located near or at an edge of the at least one chip without any risk of electrical short circuits.

According to an embodiment of this presentation, a wide range of options of chip topography (no restrictions or reduced restrictions) without short circuiting these chips with the heat spreader material is provided.

According to embodiments of this presentation, the pads of the chip(s) s are input or output pads of the chip(s).

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand ho the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this presentation with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated, Reference to "comprises" or "comprise" is not intended to respectively mean "consists of" or "consist of" unless explicitly so stated. Moreover, no element, component nor method or process step in this presentation is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A process for assembling microelectronic or semiconductor chips, comprising:
   providing at least one semiconductor chip having an active face with at least one connection pad;
   coating the active face of said at least one semiconductor chip with a conformal dielectric material layer, such that said at least one connection pad is completely coated by said conformal dielectric material layer;
   temporarily adhering said active face of said at least one semiconductor chip to a carrier wafer;

temporarily adhering the carrier wafer to a wafer with a through-cavity such that said at least one semiconductor chip extends into the through-cavity;

assembling said at least one semiconductor chip to the wafer with the through-cavity by filling the through-cavity with a metal heat spreader material;

releasing the assembled at least one semiconductor chip and wafer with the through-cavity from the carrier wafer;

removing the conformal dielectric material layer from at least a portion of said at least one connection pad; and forming at least one electrical connection to said at least a portion of said at least one connection pad.

2. The process of claim 1, wherein said coating the active face of said at least one semiconductor chip with the conformal dielectric material layer is conducted at room temperature.

3. The process of claim 1, wherein said conformal dielectric material layer is transparent.

4. The process of claim 1, wherein said conformal dielectric material layer is 0.1 to less than 10 micrometers thick.

5. The process of claim 4, wherein said conformal dielectric material layer is 0.5 micrometers thick.

6. The process of claim 1, wherein said conformal dielectric material layer comprises parylene, aluminum oxide ($Al_2O_3$), epoxy, or a photoresist.

7. The process of claim 1, wherein said conformal dielectric material layer comprises parylene N, parylene C, parylene AF-4, parylene X, parylene VT-4, parylene D, parylene M, or parylene E.

8. The process of claim 1, wherein said coating the active face of said at least one semiconductor chip with the conformal dielectric material layer comprises:

depositing said conformal dielectric material layer via chemical vapor deposition.

9. The process of claim 1, wherein said coating the active face of said at least one semiconductor chip with the conformal dielectric material layer comprises:

depositing said conformal dielectric material layer via physical vapor deposition.

10. The process of claim 1, wherein said coating the active face of said at least one semiconductor chip with the conformal dielectric material layer comprises:

a spray coating process; or an atomic layer deposition process; or a plasma deposition process.

11. The process of claim 1, wherein said removing the conformal dielectric material layer from at least a portion of said at least one connection pad comprises oxygen plasma etching said conformal dielectric material layer from at least said portion of said at least one connection pad.

12. The process of claim 1, wherein said providing at least one semiconductor chip having an active face with at least one connection pad comprises contacting said connection pad and testing that said chip is functional.

13. The process of claim 1, wherein said coating the active face of said at least one semiconductor chip with the conformal dielectric material layer comprises fluidly sealing said at least one connection pad of said at least one semiconductor chip with the conformal dielectric material layer.

14. The process of claim 1, wherein said conformal dielectric material layer comprises parylene.

15. A process for assembling microelectronic or semiconductor chips, comprising:

providing at least one semiconductor chip having an active face with at least one connection pad;

coating the active face of said at least one semiconductor chip with a conformal material layer, such that said at least one connection pad is completely coated by said conformal material layer;

temporarily adhering said active face of said at least one semiconductor chip to a carrier wafer;

temporarily adhering the carrier wafer to a wafer with a through-cavity such that said at least one semiconductor chip extends into the through-cavity;

assembling said at least one semiconductor chip to the wafer with the through-cavity by filling the through-cavity with a metal heat spreader material, wherein said filling the through-cavity comprises bringing an electrodeposition solution in contact with a conductive membrane formed on a backside of said at least one semiconductor chip and with the conformal material layer, and wherein said electrodeposition solution does not chemically react with said conformal material layer;

releasing the assembled at least one semiconductor chip and wafer with the through-cavity from the carrier wafer;

removing the conformal material layer from at least a portion of said at least one connection pad; and forming at least one electrical connection to said at least a portion of said at least one connection pad.

16. The process of claim 15, wherein the material layer fluidly seals said at least one connection pad from the electrodeposition solution.

* * * * *